United States Patent
Lin et al.

(10) Patent No.: US 9,541,836 B2
(45) Date of Patent: Jan. 10, 2017

(54) METHOD AND APPARATUS FOR BAKING PHOTORESIST PATTERNS

(71) Applicant: Taiwan Semiconductor Manufacturing Co., Ltd, Hsin-Chu (TW)

(72) Inventors: Chin-Min Lin, Zhudong Township, Hsinchu County (TW); De-Fang Huang, Hsinchu (TW); Ching-Hui Tsao, Zhudong Township, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 343 days.

(21) Appl. No.: 14/176,314

(22) Filed: Feb. 10, 2014

(65) Prior Publication Data

US 2015/0227050 A1    Aug. 13, 2015

(51) Int. Cl.
| | |
|---|---|
| *F27B 5/14* | (2006.01) |
| *H01L 21/67* | (2006.01) |
| *H01L 21/66* | (2006.01) |
| *H01L 21/027* | (2006.01) |
| *G03F 7/40* | (2006.01) |
| *H01L 21/677* | (2006.01) |
| *F27B 17/00* | (2006.01) |

(52) U.S. Cl.
CPC . *G03F 7/40* (2013.01); *F27B 5/14* (2013.01); *H01L 21/67103* (2013.01); *H01L 21/67115* (2013.01); *H01L 21/67748* (2013.01); *F27B 17/0025* (2013.01); *H01L 21/0271* (2013.01)

(58) Field of Classification Search
CPC  G03F 7/40; H01L 21/67103; H01L 21/67115; H01L 21/67748; H01L 21/0271
See application file for complete search history.

(56) References Cited

U.S. PATENT DOCUMENTS

| | | | | |
|---|---|---|---|---|
| 4,749,436 | A * | 6/1988 | Minato | G03F 7/2024 156/345.1 |
| 4,840,876 | A * | 6/1989 | Arai | G03F 7/40 430/328 |
| 4,882,263 | A * | 11/1989 | Suzuki | G03F 7/2024 430/326 |
| 4,888,271 | A * | 12/1989 | Suzuki | G03F 7/2024 430/326 |
| 2001/0053500 | A1* | 12/2001 | Jeoung | G03F 7/2024 430/311 |
| 2007/0287091 | A1* | 12/2007 | Jacobo | G03F 7/2008 430/154 |
| 2009/0023284 | A1* | 1/2009 | Lin | F27B 17/0025 438/618 |
| 2009/0156019 | A1* | 6/2009 | Satoh | H01L 21/3105 438/798 |

(Continued)

*Primary Examiner* — Joseph M Pelham
(74) *Attorney, Agent, or Firm* — McClure, Qualey & Rodack, LLP

(57) ABSTRACT

In accordance with some embodiments, a method and an apparatus for baking photoresist patterns are provided. The method includes putting a wafer over a heating assembly. A photoresist pattern is formed over a top surface of the wafer. The method further includes curing the wafer from the top surface of the wafer by a curing assembly while heating the wafer from a bottom surface of the wafer by a heating assembly.

20 Claims, 8 Drawing Sheets

(56) References Cited

U.S. PATENT DOCUMENTS

2014/0238958 A1* 8/2014 Zafiropoulo ....... B23K 26/0066
                                                    219/121.6
2014/0340665 A1* 11/2014 Shih .................... G03F 7/70191
                                                    355/71

* cited by examiner

METHOD AND APPARATUS FOR BAKING PHOTORESIST PATTERNS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are manufactured on a single semiconductor wafer, and individual dies on the wafer are singulated by sawing between the integrated circuits along a scribe line. The individual dies are packaged separately, in multi-chip modules, or in other types of packaging, for example.

Lithography processes are widely used to form photoresist patterns on semiconductor wafers. Lithography processes include hard-baking processes to solidify the photoresist patterns.

Therefore, it is desirable to improve the hard-baking process.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. It is understood that additional operations can be provided before, during, and after the method, and some of the operations described can be replaced or eliminated for other embodiments of the method.

In some embodiments, a method and an apparatus for baking photoresist patterns are provided. The apparatus includes a curing assembly and a heating assembly. The curing assembly is positioned opposite to a heating assembly. The curing assembly is configured to heat and/or cure a wafer from a top surface of the wafer while the heating assembly is configured to heat a wafer from a bottom surface of the wafer during a baking process.

Figure 1:
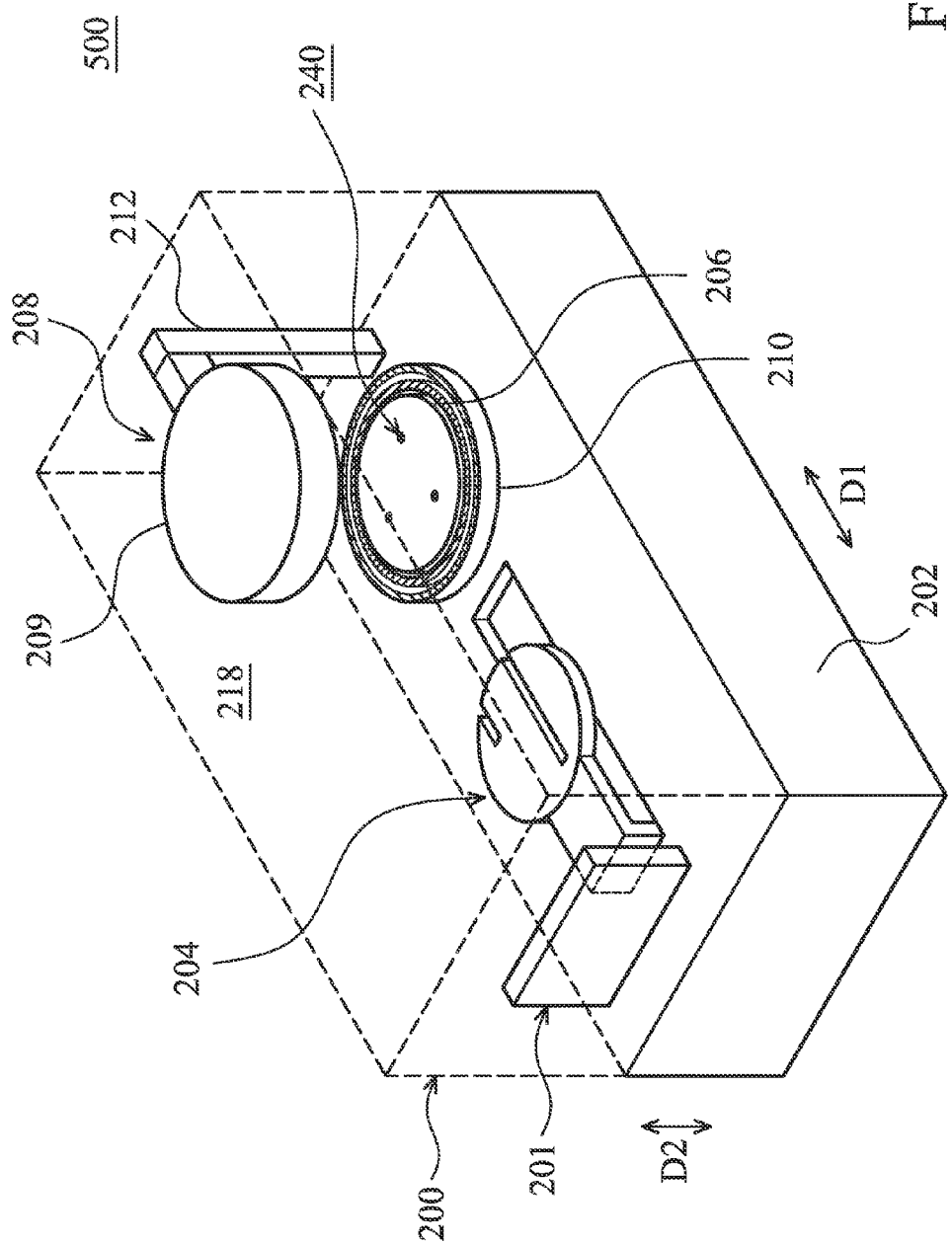
FIG. 1 is a perspective view of a baking apparatus in accordance with some embodiments of the disclosure.
Figure 2:
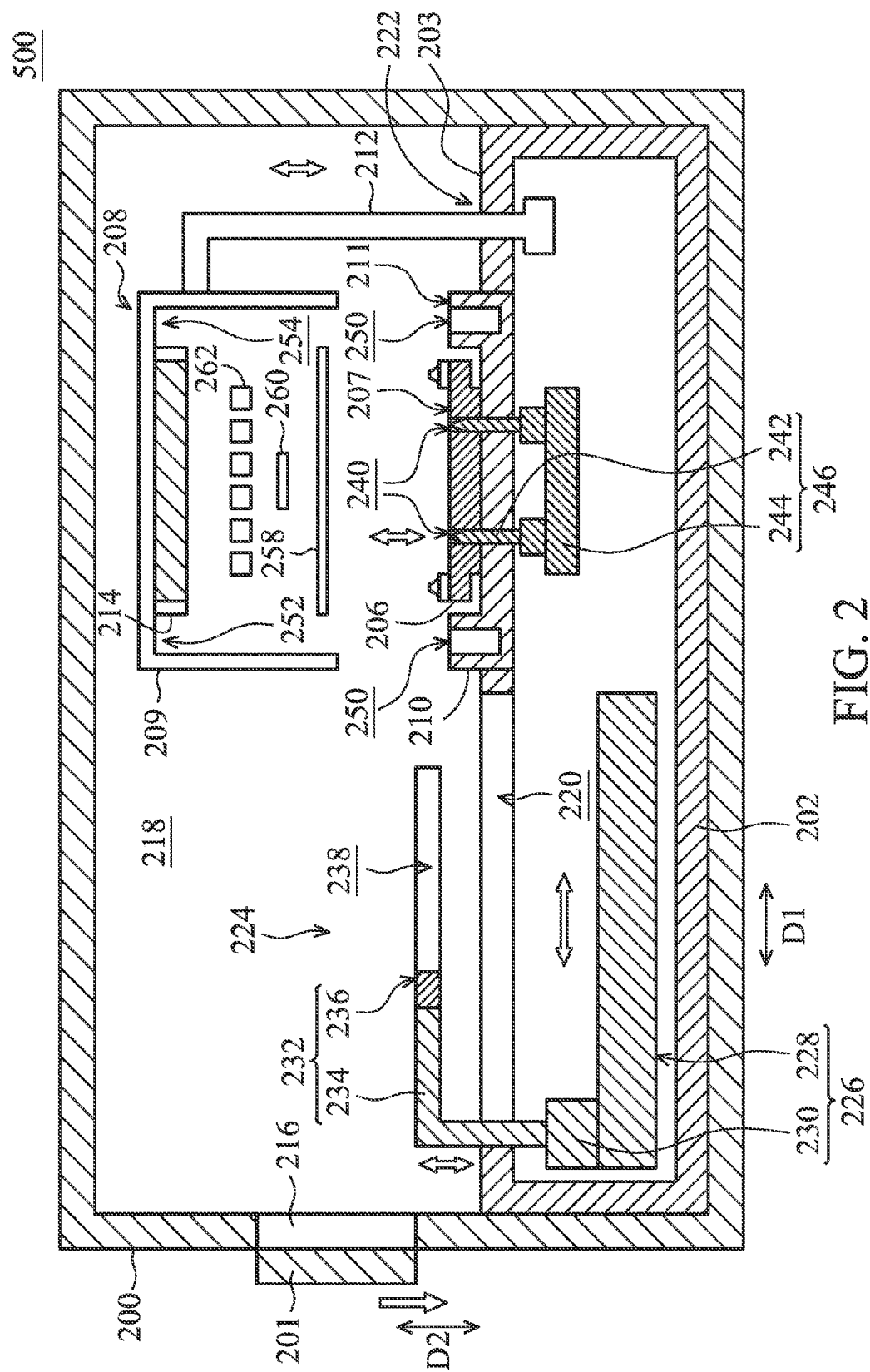
FIG. 2 is a cross-sectional view of the baking apparatus in accordance with some embodiments of the disclosure.

FIG. 1 is a perspective view of a baking apparatus 500 in accordance with some embodiments of the disclosure. FIG. 2 is a cross-sectional view of the baking apparatus 500 in accordance with some embodiments of the disclosure. As shown in FIGS. 1 and 2, the baking apparatus 500 includes a heating assembly 206 and a curing assembly 214. In some embodiments, the baking apparatus 500 further includes a housing 200, a door 201, a support base 202, a moving device 204, a cover 208 and an air-exhaust assembly 210.

The housing 200 creates a chamber 218 for a baking process. In some embodiments, the housing 200 has a door opening 216. The door opening 216 is communicated with the chamber 218. The door 201 is movably positioned on the housing 200. The door opening 216 is alternately covered by the door 201. Namely, the door 201 is alternately opened or closed relative to the housing 200. In some embodiments, the housing 200 is formed of stainless steel.

In some embodiments, the support base 202 is positioned in the housing 200, inside the chamber 218. The support base 202 has openings 220 and 222. The opening 220 is configured to accommodate a wafer transfer assembly 224 which is configured to alternately move a wafer to a baking position and to a cooling position. The opening 222 is configured to accommodate a cover 208.

The wafer transfer assembly 224 is positioned over the support base 202, as shown in FIG. 2 in accordance with some embodiments. The wafer transfer assembly 224 includes a moving mechanism 226 and a cooling arm 232. The moving mechanism 226 is positioned in the support base 202. The cooling arm 232 is movably positioned over the moving mechanism 226 and the support base 202. Also, the cooling arm 232 is connected to the moving mechanism 226. Further, the cooling arm 232 is able to be moved along a direction D1 by the moving mechanism 226.

In some embodiments, the moving mechanism 226 includes a tack 228 and an elevating element 230, as shown in FIG. 2 in accordance with some embodiments. The tack 228 is extended along the direction D1. The elevating element 230 is movably positioned on the tack 228, and is moveable along the tack 228. The cooling arm 232 is positioned on the elevating element 230. The cooling arm 232 is able to be moved up or down by the elevating element 230 along a direction D2. In some embodiments, the direction D2 is perpendicular to the direction D1.

The cooling arm 232 includes a connecting stand 234 and a cooling plate 236, as shown in FIG. 2 in accordance with some embodiments. The connecting stand 234 is disposed on the elevating element 230, connected to the cooling plate 422, and passes through the opening 220. As shown in FIG. 2, the connecting stand 234 is an L-shaped structure in a cross section view in accordance with some embodiments. The cooling plate 236 is connected to the connecting stand 234. In some embodiments, the cooling plate 236 includes slots 238. The cooling plate 236 is configured for a wafer to be disposed on. Therefore, the size of the cooling plate 236 corresponds to the size of the wafer. In some embodiments, the cooling plate 236 is substantially parallel to a horizontal plane and/or an upper surface 203 of the support base 202.

In some embodiments, the heating assembly 206 is positioned over the upper surface 203 of the support base 202. The heating assembly 206 may include a hot plate. In some embodiments, the heating assembly 206 is parallel to a horizontal plane and/or the upper surface 203. In some embodiments, the heating assembly 206 includes a number of through holes 240. The through holes 240 may be vertical through holes. In some embodiments, a number of heating coils is built in the heating assembly 206. The heating assembly 206 is configured to heat a wafer from a bottom surface of the wafer during the baking process. In some embodiments, the heating assembly 206 is formed of a thermal conductive material such as aluminum.

Figure 4:
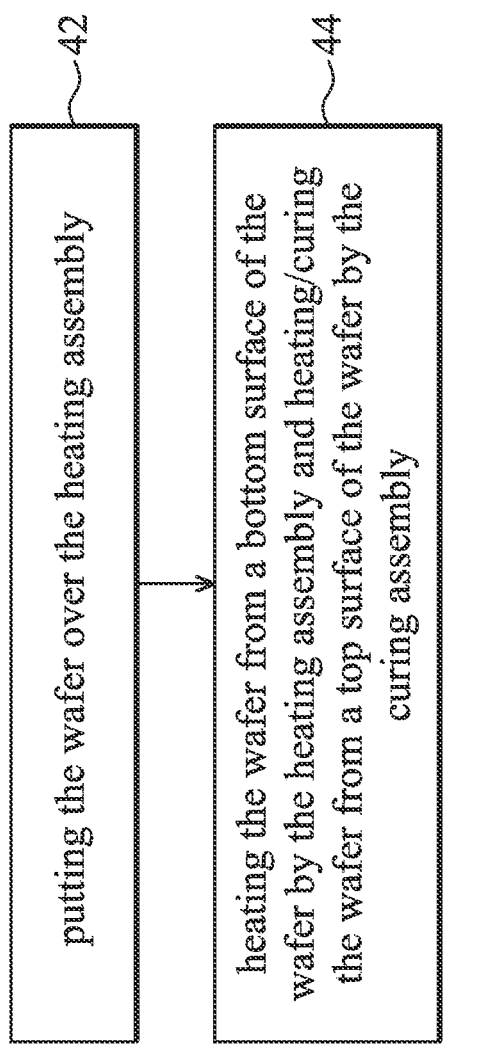
FIG. 4 is a flow chart of a baking process performed by the baking apparatus in accordance with some embodiments of the disclosure.
Figure 7:
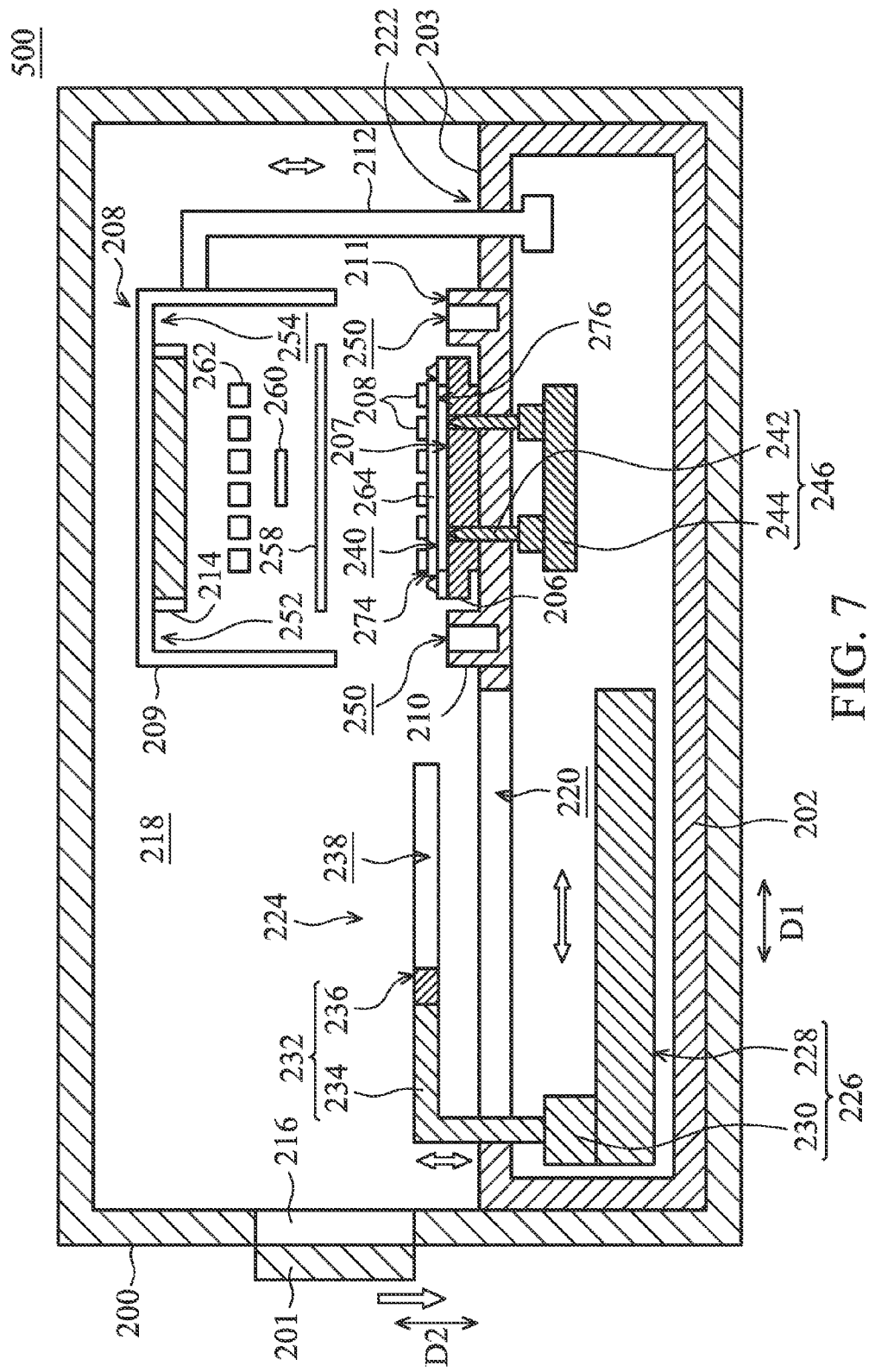

Afterwards, in an operation 42, the cooling plate 236 is moved down along the direction d2 by the moving mechanism 226, and is moved away from the heating assembly 206 by the moving mechanism 226 as shown in FIGS. 4 and 7. Afterwards, the pin 242 is moved down by the elevating mechanism 244 to put the wafer 264 over the heating assembly 206.

In some embodiments, the cover 208 is positioned in the housing 200, and in the chamber 218. The cover 208 is positioned opposite the support base 202. In some embodiments, the cover 208 includes a cap 209 and a support arm 212. The cap 209 is positioned above the heating assembly 206 and the elevating assembly 246. The cap 209 is connected to the support arm 212. The support arm 212 is movably positioned in the support base 202. The cap 209 is able to be moved up or down by the support arm 212 along a direction D2.

In some embodiments, the air-exhaust assembly 210 is positioned over the upper surface 203 of the support base 202. In some embodiments, the air-exhaust assembly 210 is positioned surrounding the heating assembly 206. The heating assembly 206 is supported by the air-exhaust assembly 210. In some embodiments, a gas outlet 250 is positioned in an upper surface 211 of the air-exhaust assembly 210. During the baking process, the cap 209 of the cover 208 is moved down to be close to the air-exhaust assembly 210 to form a space for the baking process to accommodate the heating assembly 206. The air-exhaust assembly 210 is configured to exhaust air or other process gases in the space through the gas outlet 250 during the baking process.

In some embodiments, a curing assembly 214 is designed to be positioned over the cover 208. The curing assembly 214 is designed to face the heating assembly 206. For example, the curing assembly 214 is positioned on an innerwall 252 of the cap 209. Also, the innerwall 252 of the cap 209 faces the heating assembly 206. For example, the curing assembly 214 is positioned in an accommodation space 254 formed by the cap 209. Therefore, the curing assembly 214 is positioned opposite to the heating assembly 206. The curing assembly 214 is configured to cure and/or heat the wafer from a top surface of the wafer while the heating assembly 206 is heating the wafer from a bottom surface of the wafer during the baking process. For example, after developing photoresist pattern over the wafer, the wafer is cured from a top surface thereof by the curing assembly 214. In some embodiments, the curing assembly 214 includes an ultra-violet (UV) lamp, a heating coil, other applicable curing assemblies, or a combination thereof. For example, if the curing assembly 214 is a UV lamp, the curing assembly 214 provides a UV curing function. For example, if the curing assembly 214 is a heating coil which converts electricity into heat, the curing assembly 214 provides a heating function and/or a thermal curing function.

Figure 3:
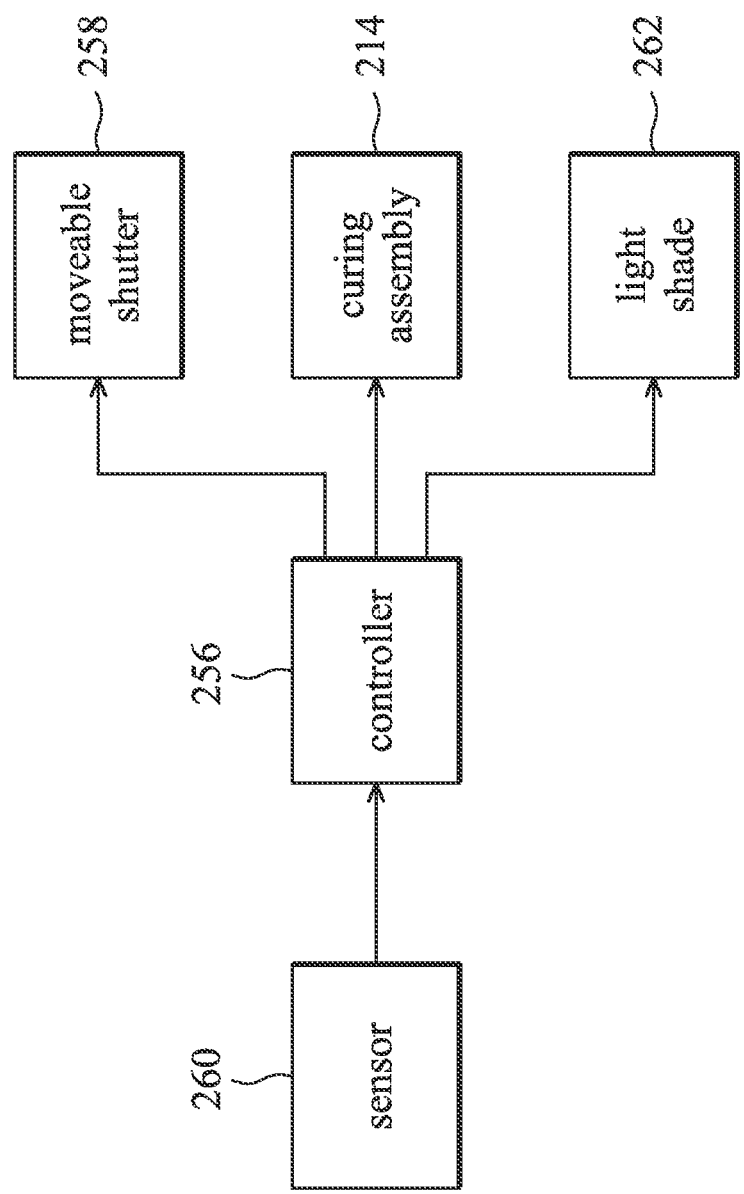
FIG. 3 is a partial block diagram of a baking apparatus in accordance with some embodiments of the disclosure showing the connection between a controller, a sensor, a curing assembly, a moveable shutter, and a light shade.

In some embodiments, an energy generated by the curing assembly 214 can be controlled by various elements. FIG. 3 is a partial block diagram of a baking apparatus in accordance with some embodiments of the disclosure showing the connection between a controller 256, a sensor 260, the curing assembly 214, a moveable shutter 258, and a light shade 262. As shown in FIG. 3, the controller 256, for example a computer, is coupled to the curing assembly 214. In some embodiments, the controller 256 is configured to adjust a magnitude of an energy generated from the curing assembly 214. For example, if the curing assembly 214 is a UV lamp, the controller 256 can be designed to store various process recipes to control an intensity of a UV light emitted from the UV lamp for different process conditions. For example, if the curing assembly 214 is a heating coil, the controller 256 can be designed to store various power setting process recipes to control the power of the heating coil for different process conditions.

In some embodiments, a moveable shutter 258 is positioned in the housing 200, between the heating assembly 206 and the curing assembly 214, as shown in FIG. 2. Also, the moveable shutter 258 is positioned in the accommodation space 254 formed by the cap 209. In some embodiments, the moveable shutter 258 is configured to alternatively substantially block the energy generated from the curing assembly 214 to the wafer 264. In some other embodiments, the moveable shutter 258 is configured to partially block the energy generated from the curing assembly 214 to the wafer 264. In some embodiments, the moveable shutter 258 is coupled to and controlled by the controller 256.

In some embodiments, a sensor 260 is positioned in the housing 200, between the curing assembly 214 and the moveable shutter 258, as shown in FIG. 2. The sensor 260 is positioned in the accommodation space 254 formed by the cap 209. In some embodiments, the sensor 260 is configured to measure a magnitude of the energy generated from the curing assembly 214. For example, if the curing assembly 214 is a UV lamp, the sensor 260 is configured to measure an intensity of a UV light emitted from the UV lamp. For example, if the curing assembly 214 is a heating coil, the sensor 260 is configured to measure a power of the heating coil. In some embodiments, the sensor 260 is coupled to the controller 256. In some embodiments, the measurement result of the sensor 260 can be feed back to the controller 256 as shown in FIG. 3. Therefore, the controller 256 can in-situ adjust the energy (intensity/power) generated from the curing assembly 214 according to the measurement result by the sensor 260 during the baking process.

In some embodiments, with a UV lamp serving as the curing assembly 214, a number of light shades 262 are designed to be positioned between the curing assembly 214 (UV lamp) and the shutter 258. In some embodiments, the light shade 262 is configured to block a portion of UV light from the curing assembly 214 (UV lamp) to adjust an intensity of the curing assembly 214 (UV lamp). In some embodiments, the light shades 262 is coupled to and controlled by the controller 256.

Figure 5:
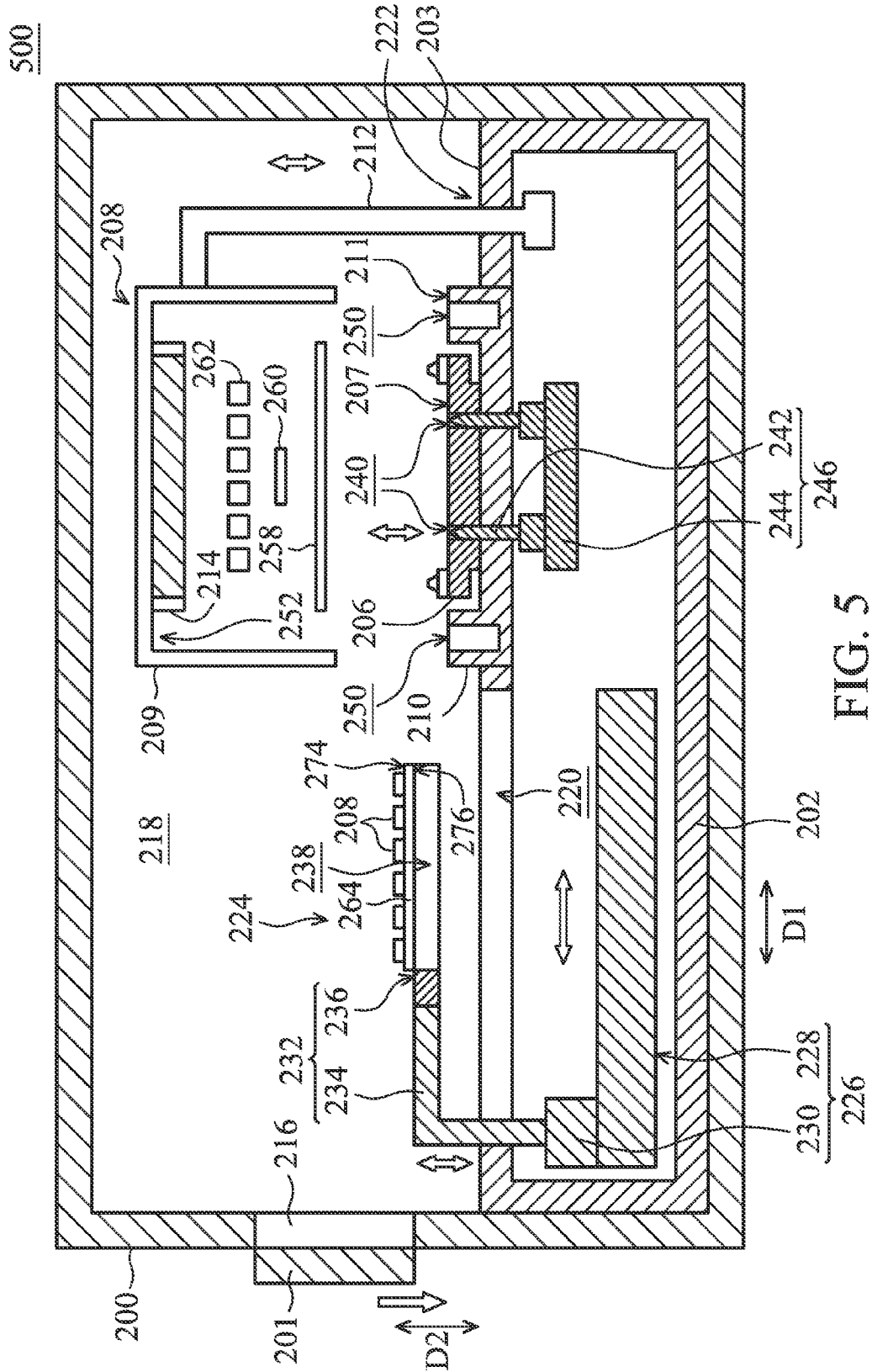
FIGS. 5-8 are cross-sectional views of various stages of a baking process using the baking apparatus in accordance with some embodiments of the disclosure.

FIG. 4 is a flow chart of a baking process performed by the baking apparatus 500 in accordance with some embodiments of the disclosure. FIGS. 5-8 are cross-sectional views of various stages of a baking process using the baking apparatus in accordance with some embodiments of the disclosure. Please refer FIG. 5, a semiconductor substrate, for example, a wafer 264, is positioned over a cooling plate 236 of a wafer transfer assembly 224 in accordance with some embodiments. In some embodiments, at least one photoresist pattern is formed over the wafer 264. In some embodiments as shown in FIG. 5, photoresist patterns 280 are formed over the wafer 264. After positioning the wafer 264 over the cooling plate 236, the door 201 is closed relative to the housing 200 to prevent particles in the chamber 218 from floating out of the housing 200 via the door opening 216.

Figure 6:
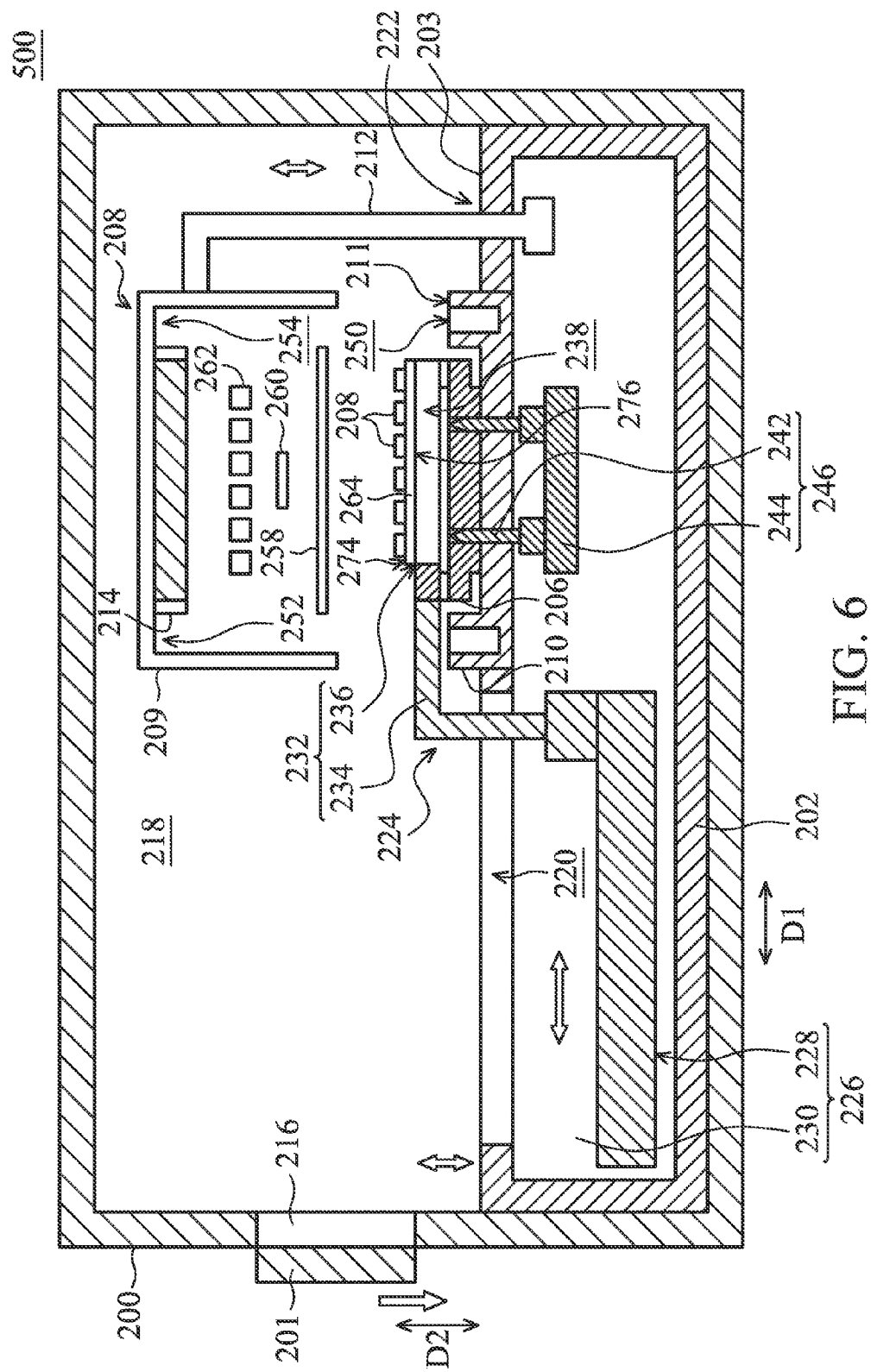

Afterwards, a cooling arm 232 of the wafer transfer assembly 224 is moved to the heating assembly 206 by a moving mechanism 226 as shown in FIG. 6 in accordance with some embodiments. Afterwards, when the cooling plate 236 is located over the heating assembly 206, the pins 242 protrude over the upper surface 207 of the heating assembly 206 by the elevating mechanism 242 as shown in FIG. 6 in accordance with some embodiments. The pins 242 further pass through the slots 238 of the cooling plate 236, and come into contact with a bottom surface 276 of the wafer 264.

Afterwards, in an operation 42, the cooling plate 236 is moved down along the direction D2 by the moving mechanism 234, and is moved away from the heating assembly 206 by the moving mechanism 234 as shown in FIGS. 4 and 7. Afterwards, the pin 242 is moved down by the elevating mechanism 244 to put the wafer 264 over the heating assembly 206.

Figure 8:
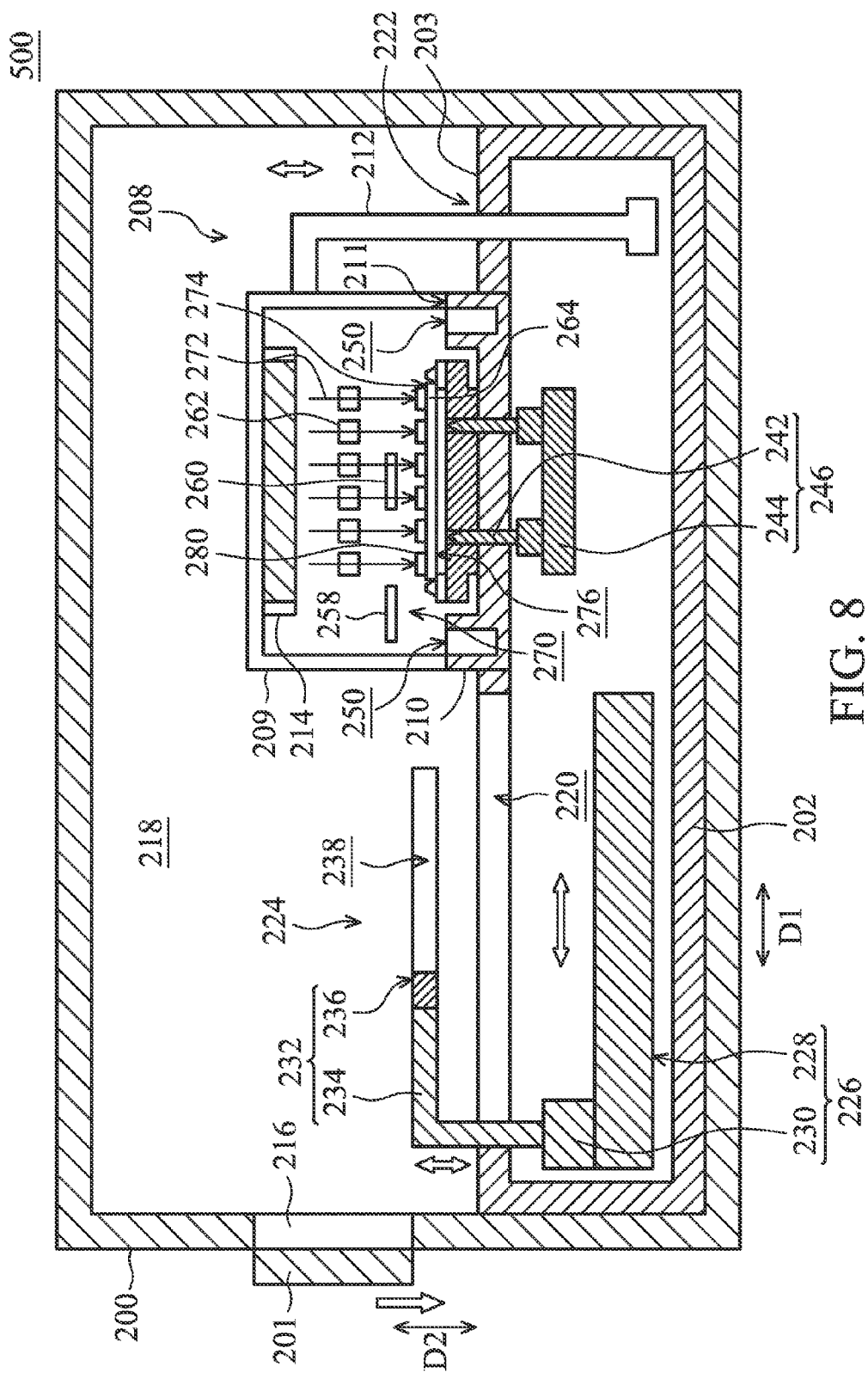

Afterwards, in an operation 44, the cap 209 of the cover 208 is moved down to be close to the air-exhaust assembly 210 to form a space 270 for the baking process by moving the support arm 212 along the direction D2 as shown in FIGS. 4 and 8. The curing assembly 214 positioned over the cover 208 is moved down to be close to the top surface 274 of the wafer 264. As shown in FIG. 8, the space 270 accommodates the heating assembly 206, the curing assembly 214 and the moveable shutter 258. After the cover 208 is moved down, the moveable shutter 258 can be designed to be folded and/or moved close to a side of the cap 209 (for example, the left side of the cap). As a result, the top surface 274 of the wafer 264 is exposed to the curing assembly 214. Afterwards, the heating assembly 206 heats the wafer 264 from the bottom surface 276 of the wafer 264 while the curing assembly 214 generates an energy 272 (heat/UV light) to heated and/or cured the wafer 264 from the top surface 274 of the wafer 264. For example, after developing the photoresist patterns 280 over the wafer 264, the photoresist patterns 280 formed over the wafer 264 are cured from a top surface of the photoresist patterns 280 by the curing assembly 214 while the heating assembly 206 cures the photoresist patterns 280 on the wafer 264 from the bottom surface 276 of the wafer 264 in the operation 44. In some embodiments, top portions and bottom portions of the photoresist patterns 280 formed on the wafer 264 are heated and/or cured in the same baking process. Therefore, amount of shrinkage of the top portions and bottom portions of the photoresist patterns 280 is uniformly controlled by both the heating assembly 206 and the curing assembly 214. Shrinkage profiles of the top portions and bottom portions of the photoresist patterns 280 are well controlled. In some embodiments, the air-exhaust assembly 210 exhausts air or other process gases in the space through the gas outlet 250 during the baking process.

In some embodiments, the controller 256 as shown in FIG. 3 is implemented in a computer programmed according to various embodiments of the present disclosure to control the operation of the curing assembly 214. For example, if the curing assembly 214 is a UV lamp, the controller 256 can store various process recipes to control an intensity of a UV light emitted from the UV lamp for different process conditions. Alternatively, if the curing assembly 214 is a heating coil, the controller 256 can be designed to store various power setting process recipes to control the power of the heating coil for different process conditions. Therefore, the energy applied to the top surface 274 and the bottom surface 276 of the wafer 264 would be controlled during the baking process (operation 44).

In some embodiments, the controller 256 as shown in FIG. 3 is coupled to the moveable shutter 258 to control the moveable shutter 258 positioned in the housing 200, between the heating assembly 206 and the curing assembly 214. In some embodiments, the moveable shutter 258 can be designed to be folded, so that the top surface 274 of the wafer 264 is exposed to the curing assembly 214 for the baking process. In some embodiments, the energy applied to the top surface 274 of the wafer 264 by the curing assembly 214 would be alternatively substantially or partially blocked by the moveable shutter 258 during the baking process (the operation 44) to control the amount and/or profile of shrinkage of the top portions and bottom portions of the photoresist patterns 280 on the wafer 264.

In some embodiments, the controller 256 as shown in FIG. 3 is coupled to the sensor 260 to receive a magnitude of the energy generated from the curing assembly 214. For example, if the curing assembly 214 is a UV lamp, the sensor 260 is configured to measure an intensity of a UV light emitted from the UV lamp. For example, if the curing assembly 214 is a heating coil, the sensor 260 is configured to measure a power of the heating coil. In some embodiments, the measurement result of the sensor 260 can be fed back to the controller 256 as shown in FIG. 3. Therefore, the controller 256 can in-situ control the amount and/or profile of shrinkage of the top portions and bottom portions of the photoresist patterns 280 on the wafer 264 during the baking process (the operation 44).

In some embodiments with a UV lamp served as the curing assembly 214, the controller 256 as shown in FIG. 3 is coupled to the light shades 262 positioned between the curing assembly 214 (UV lamp) and the shutter 258 to control the light shades 262. For example, the light shades 262 can adjust an intensity of the curing assembly 214 (UV lamp) by blocking a portion of UV light from the curing assembly 214 (UV lamp) to the wafer 264. Therefore, the amount and/or profile of shrinkage of the top portions and bottom portions of the photoresist patterns 280 on the wafer 264 can be controlled by the light shades 262 during the baking process (operation 44).

In accordance with some embodiments, a method and an apparatus for baking photoresist patterns are provided. A curing assembly is positioned opposite to a heating assembly. The curing assembly is configured to heat and/or cure a wafer from a top surface of the wafer while the heating assembly is configured to heat a wafer from a bottom surface of the wafer during a baking process. After developing photoresist patterns on the wafer, top portions and bottom portions of the photoresist patterns formed on the wafer can be heated/cured by both the heating assembly and the curing assembly in the same baking process. The amounts of shrinkage of the top portions and bottom portions of the photoresist patterns are uniform by controlling both the heating assembly and the curing assembly. Also, the shrinkage profiles of the top portions and bottom portions of the photoresist patterns are well controlled.

In some embodiments, a method for baking a wafer is provided. The method includes putting a wafer over a heating assembly. A photoresist pattern is formed over a top surface of the wafer. The method further includes curing the wafer from the top surface of the wafer by a curing assembly during heating the wafer from a bottom surface of the wafer by a heating assembly.

In some embodiments, a method for baking a semiconductor substrate is provided. The method includes putting a semiconductor substrate over a heating assembly to ensure that a bottom surface of the semiconductor substrate is close to the heating assembly. The method also includes moving a curing assembly to be close to a top surface of the semiconductor substrate. The method further includes heating the bottom surface of the semiconductor substrate by the heating assembly and curing the top surface of the semiconductor substrate by the curing assembly simultaneously.

In some embodiments, a baking apparatus is provided. The baking apparatus includes a housing. The baking apparatus also includes a support base positioned in the housing. The baking apparatus further includes a cover in the housing, opposite the support base. In addition, the baking apparatus includes a heating assembly positioned on the support base, configured to heat a wafer from a bottom surface of the wafer. The baking apparatus also includes a curing assembly positioned in an accommodation space formed by the cover. The curing assembly is configured to cure the wafer from a top surface of the wafer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for baking a wafer, comprising:
putting a wafer over a heating assembly, wherein a photoresist pattern is formed over a top surface of the wafer;
moving down a curing assembly to be close to the top surface of the wafer by a support arm moving down a cap, wherein the cap is positioned over the heating assembly and connected to the support arm, and the curing assembly is fixed in the cap; and
curing the wafer from the top surface of the wafer by the curing assembly while heating the wafer from a bottom surface of the wafer by the heating assembly.

2. The method as claimed in claim 1, further comprising:
substantially blocking an energy generated from the curing assembly to the wafer during curing the wafer from the top surface of the wafer by the curing assembly.

3. The method as claimed in claim 1, further comprising:
partially blocking an energy generated from the curing assembly to the wafer during curing the wafer from the top surface of the wafer by the curing assembly.

4. The method as claimed in claim 1, further comprising:
measuring a magnitude of an energy generated from the curing assembly during curing the wafer from the top surface of the wafer by the curing assembly.

5. The method as claimed in claim 4, further comprising:
in-situ adjusting the energy generated from the curing assembly according to a result of measuring a magnitude of the energy generated from the curing assembly during curing the wafer from the top surface of the wafer by the curing assembly.

6. The method as claimed in claim 1, further comprising:
exhausting a gas in a space accommodating the heating assembly, the curing assembly and the wafer during curing the wafer from the top surface of the wafer by the curing assembly.

7. The method as claimed in claim 1, further comprising:
adjusting a magnitude of an energy generated from the curing assembly during curing the wafer from the top surface of the wafer by the curing assembly.

8. A method for baking a semiconductor substrate, comprising:
putting a semiconductor substrate over a heating assembly to ensure that a bottom surface of the semiconductor substrate is close to the heating assembly;
moving down a curing assembly to be close to a top surface of the semiconductor substrate by a support arm moving down a cap, wherein the cap is positioned over the heating assembly and connected to the support arm, and the curing assembly is fixed in the cap; and
heating the bottom surface of the semiconductor substrate by the heating assembly and curing the top surface of the semiconductor substrate by the curing assembly simultaneously.

9. The method as claimed in claim 8, further comprising:
substantially blocking an energy generated from the curing assembly to the semiconductor substrate during heating the bottom surface of the semiconductor substrate by the heating assembly and curing the top surface of the semiconductor substrate by the curing assembly simultaneously.

10. The method as claimed in claim 8, further comprising:
partially blocking an energy generated from the curing assembly to the semiconductor substrate during heating the bottom surface of the semiconductor substrate by the heating assembly and curing the top surface of the semiconductor substrate by the curing assembly simultaneously.

11. The method as claimed in claim 8, further comprising:
forming a photoresist pattern over the semiconductor substrate before putting the semiconductor substrate over the heating assembly.

12. The method as claimed in claim 8, further comprising:
measuring a magnitude of an energy generated from the curing assembly during heating the bottom surface of the semiconductor substrate by the heating assembly and curing the top surface of the semiconductor substrate by the curing assembly simultaneously.

13. The method as claimed in claim 12, further comprising:
in-situ adjusting the energy generated from the curing assembly according to a result of measuring a magnitude of the energy generated from the curing assembly during heating the bottom surface of the semiconductor substrate by the heating assembly and curing the top surface of the semiconductor substrate by the curing assembly simultaneously.

14. The method as claimed in claim 8, further comprising:
adjusting a magnitude of an energy generated from the curing assembly during heating the bottom surface of the semiconductor substrate by the heating assembly and curing the top surface of the semiconductor substrate by the curing assembly simultaneously.

15. A baking apparatus, comprising:
a housing;
a support base positioned in the housing;
a cover in the housing, opposite the support base, wherein the cover comprises a support arm movably positioned on the support base, and a cap connected to the support arm;
a heating assembly positioned on the support base, configured to heat a wafer from a bottom surface of the wafer; and
a curing assembly, positioned in an accommodation space formed by the cap, wherein the curing assembly is configured to cure the wafer from a top surface of the wafer,
wherein the curing assembly is moved down to be close to the top surface of the wafer by the support arm moving down the cap before the curing assembly cures the wafer.

16. The baking apparatus as claimed in claim 15, further comprising:
a moveable shutter positioned in the housing, between the heating assembly and the curing assembly, wherein the moveable shutter is configured to block an energy generated from the curing assembly.

17. The baking apparatus as claimed in claim 16, further comprising:
a sensor positioned between the curing assembly and the moveable shutter, wherein the sensor is configured to measure a magnitude of an energy generated from the curing assembly.

18. The baking apparatus as claimed in claim 15, further comprising:
an air-exhaust assembly positioned on the support base, wherein when the cover is close to the support base to form a space to accommodate the heating assembly, the curing assembly and the moveable shutter, the air-exhaust assembly is configured to exhaust a gas in the space.

19. The baking apparatus as claimed in claim 16, wherein the curing assembly comprises an ultra-violet (UV) lamp or a heating coil.

20. The baking apparatus as claimed in claim 15, wherein the curing assembly is the UV lamp, the baking apparatus further comprises a light shade positioned between the UV lamp and the shutter, wherein the light shade is configured to block a portion of UV light from the UV lamp to adjust an intensity of the UV lamp.

* * * * *